US012681113B2

(12) United States Patent
Bollenbeck

(10) Patent No.: US 12,681,113 B2
(45) Date of Patent: Jul. 14, 2026

(54) TRANSMIT DEVICE FOR GENERATING A MULTI-FREQUENCY PILOT TONE AND MAGNETIC RESONANCE TOMOGRAPH WITH TRANSMIT DEVICE

(71) Applicant: Siemens Healthineers AG, Forchheim (DE)

(72) Inventor: Jan Bollenbeck, Eggolsheim (DE)

(73) Assignee: Siemens Healthineers AG, Forchheim (DE)

( * ) Notice: Subject to any disclaimer, the term of this patent is extended or adjusted under 35 U.S.C. 154(b) by 123 days.

(21) Appl. No.: 18/616,641

(22) Filed: Mar. 26, 2024

(65) Prior Publication Data

US 2024/0329170 A1 Oct. 3, 2024

(30) Foreign Application Priority Data

Mar. 28, 2023 (EP) ..................................... 23164780

(51) Int. Cl.
| | |
|---|---|
| *G01R 33/36* | (2006.01) |
| *G01R 33/54* | (2006.01) |
| *G01R 33/565* | (2006.01) |
| *G01R 33/567* | (2006.01) |

(52) U.S. Cl.
CPC ....... *G01R 33/3628* (2013.01); *G01R 33/543* (2013.01); *G01R 33/56509* (2013.01); *G01R 33/5673* (2013.01)

(58) Field of Classification Search
CPC .. G01R 33/3628; G01R 33/543; G01R 33/36; G01R 33/56509; G01R 33/5673; G01R 33/48
See application file for complete search history.

(56) References Cited

U.S. PATENT DOCUMENTS

| | | | |
|---|---|---|---|
| 8,456,165 B2 * | 6/2013 | Schwilch | ............. G01R 33/389 324/309 |
| 2015/0244515 A1 * | 8/2015 | Bollenbeck | ........... H04L 7/0331 375/376 |
| 2015/0320342 A1 | 11/2015 | Biber | |
| 2020/0396112 A1 * | 12/2020 | Biber | ................. G01R 33/5608 |
| 2021/0325525 A1 | 10/2021 | Biber | |
| 2022/0361822 A1 | 11/2022 | Speier | |

FOREIGN PATENT DOCUMENTS

EP 3895610 A1 10/2021

OTHER PUBLICATIONS

Ludwig Juliane et al: "Pilot tone-based motion correction for prospective respiratory compensated cardiac eine MRI", Magnetic Resonance in Medicine, vol. 85, No. 5, Nov. 23, 2020 (Nov. 23, 2020), pp. 2403-2416, XP093001018, US ISSN: 0740-3194, DOI: 10.1002/mrm.28580; Retrieved from the Internet: URL:https://onlinelibrary.wiley.com/doi/full-xml/10.1002/mrm.28580; 2020.
Wiikpedia "Crystal oscillator" https://en.wikipedia.org/wiki/Crystal_oscillator.

* cited by examiner

*Primary Examiner* — Rishi R Patel
(74) *Attorney, Agent, or Firm* — Lempia Summerfield Katz LLC

(57) ABSTRACT

A transmit device for a pilot tone signal with a plurality of discrete frequency components and a magnetic resonance tomograph with such a transmit device. The transmit device includes a frequency stabilization unit that is configured to keep constant a frequency difference between the plurality of frequency components.

9 Claims, 2 Drawing Sheets

FIG 1

TRANSMIT DEVICE FOR GENERATING A MULTI-FREQUENCY PILOT TONE AND MAGNETIC RESONANCE TOMOGRAPH WITH TRANSMIT DEVICE

CROSS REFERENCE TO RELATED APPLICATIONS

This application claims the benefit of EP 23164780.1 filed on Mar. 28, 2023, which is hereby incorporated by reference in its entirety.

FIELD

Embodiments relate to a transmit device of a magnetic resonance tomograph.

BACKGROUND

Magnetic resonance tomographs are image-generating apparatuses that, for the purposes of imaging an object under examination, orient nuclear spins of the object under examination with a strong external magnetic field and excite them to precess around the orientation by an alternating magnetic field. The precession or return of the spins from the excited state into a lower-energy state in turn generates in response an alternating magnetic field that is received via antennas.

Spatial encoding is impressed onto the signals with the assistance of magnetic gradient fields, the encoding subsequently permitting assignment of the received signal to a volume element. The received magnetic resonance signal is then evaluated and a three-dimensional image representing the object under examination is provided.

Magnetic resonance signals are very weak. To achieve a sufficiently high signal-to-noise ratio, the signal has therefore to be acquired over a long period, in one or repeated measurements. Acquisition of the magnetic resonance signals is consequently slow in comparison with unavoidable patient movement, such as heartbeat or respiratory movement. These movements cause artifacts in the generated images.

One possible way of imaging the moving organs nevertheless involves repeatedly synchronizing brief image acquisition with the movement and averaging over the acquired data.

Synchronization may be performed using dedicated sensors such as, for example, a respiration belt or ECG electrodes.

To avoid these additional sensors, it is also already known from document US 2015/0320342 A1 to couple a continuous monofrequency alternating magnetic field originating from a small conductor loop at least in part through the patient's body into individual elements of a local MR coil.

Since most biological tissue is almost completely transparent to magnetic fields, the generated magnetic field penetrates through the patient's body almost unchanged. However, most tissue is (poorly) conductive and therefore the continuous wave magnetic field induces eddy currents. These eddy currents then in turn generate a magnetic field, that overlays the excitation field, leading to modulation in the received magnetic field in the receive coil.

By evaluating this signal, conclusions may be drawn as to a movement phase of the heart or of respiration.

Using a pilot tone signal may, however, result in the received signals and thus also the amplitude fluctuations caused by the movement being very weak and barely evaluable. The fraction of the alternating magnetic field that penetrates tissue moved by the heartbeat may also be too small and the demodulated receive signal also may in this case have an excessively low signal-to-noise ratio.

BRIEF SUMMARY AND DESCRIPTION

The scope of the present disclosure is defined solely by the claims and is not affected to any degree by the statements within this summary. The present embodiments may obviate one or more of the drawbacks or limitations in the related art. Independent of the grammatical term usage, individuals with male, female or other gender identities are included within the term.

Embodiments make the acquisition of patient movements better and more reliable.

Embodiments provide a transmit device for a pilot tone signal. A pilot tone signal is here considered to be an alternating magnetic field that is suitable for exciting eddy currents in the body region of interest, whereby alternating magnetic fields in turn arise that overlay the transmit field and carry the movement information of interest.

The pilot tone signal, for example, lies within a frequency range or reception range that may be acquired and evaluated by magnetic resonance signal receivers of a magnetic resonance tomograph. For example, the frequency range is no wider than a magnetic resonance signal, i.e., less than 1 MHz, 500 kHz, or 100 kHz. The pilot tone signal may be so narrowband that it may be received simultaneously with a magnetic resonance signal at an edge zone of the frequency range of the receiver without overlapping the latter and disrupting image acquisition. The bandwidth may be smaller than 10 kHz, 1 kHz or 500 Hz.

The transmit device is configured to generate the pilot tone signal with a plurality of discrete frequency components. In other words, a spectrum of the pilot tone includes at least two mutually separate local maxima at different frequencies. The pilot tone signal is thus not a broadband signal with a spectrum extending over a frequency range without distinct maxima. The pilot tone signal may for example also be an aggregate signal of two or more monochromatic radio frequency signals. The bandwidth of the pilot tone signal is here considered to be the spacing between the components that are furthest apart in the frequency space.

The transmit device includes a frequency stabilization unit. A frequency stabilization unit is a unit that is configured to ensure a constant frequency difference between the plurality of frequency components. This may be achieved by one or more frequency components lying close to the frequency of a reference signal and the frequency spacing thereof from the frequency of the reference signal in each case being kept constant.

The frequency components may create additional coupling paths, whose contributions may be evaluated individually as a result of spectral separation, leading overall to an enhanced SNR in the demodulated receive signal. In this respect, frequency stabilization ensures that all the frequency components of the pilot tone signal remain at predetermined frequencies that are not disruptive to image acquisition.

Embodiments further provide a magnetic resonance tomograph with a transmit device. The individual pilot tone signal frequency components are coupled by spatially separately arranged magnetic field loops. In this way, additional coupling paths are created whose contributions may be evaluated individually as a result of spectral separation, leading overall to an enhanced SNR in the demodulated receive signal.

The magnetic resonance tomograph with a transmit device shares the advantages of the transmit device.

In an embodiment, the transmit device includes a signal input for a first input signal. The input signal takes the form, for example, of radio frequency signals that provide a frequency reference or reference frequency. The frequency stabilization unit is configured to stabilize the frequency difference of the frequency components as a function of the input signal. The input signal itself may serve as a frequency component and for a second or further frequency components to be derived therefrom. Various options in this regard are described below.

The input signal makes it possible to specify a frequency that is stabilized by a central clock and prevents impairment of the magnetic resonance measurement for example by harmonics as a result of the correspondingly predetermined, stable frequency situation.

In an embodiment, the frequency stabilization unit includes a control loop with a frequency offset stabilizer. In other words, a second frequency component is generated and stabilized by a control loop with regard to its frequency spacing relative to the reference frequency, for example the input signal or a first frequency component derived therefrom. If three or more frequency components have to be generated or stabilized, multiple corresponding control loops may be provided, one for each additional frequency component.

Advantageously, signals with a small frequency spacing may also be frequency-stabilized in this way.

In an embodiment, the frequency offset stabilizer includes a frequency-voltage converter, an integrator, and a voltage-controlled oscillator. The integrator may for example be a comparator or operational amplifier that includes a capacitance in the negative feedback branch or uses the capacitance to effect negative feedback.

Unlike a phase locking circuit, by way of a frequency-voltage converter and the voltage-dependent oscillator the control loop advantageously enables frequency stabilization without secondary lines or spurious signals.

In an embodiment, the control loop includes an oscillator. This may be the voltage-dependent oscillator already mentioned above. The oscillator is configured to oscillate at a frequency equal to an odd-numbered divisor of the frequency of the output signal.

Advantageously, an oscillator with a lower fundamental frequency may be implemented using quartz crystals at the fundamental frequency that have advantageous characteristics in respect of frequency stability and control behavior. The frequency of the second frequency component may then be provided by frequency multiplication.

In an embodiment, the control loop includes a control input. The control input allows the control loop to be interrupted or set to a state in which an output frequency remains largely unchanged for the duration of the interruption. A control voltage of the loop may, for example, be kept constant by a sample and hold element.

The control input makes it possible to prevent the control loop from being disturbed and going out of control during an excitation pulse.

In an embodiment, the magnetic resonance tomograph is configured to supply an input signal of predetermined frequency to the transmit device, such that the input signal and the frequency components derived therefrom do not disrupt reception of the magnetic resonance signals. This may be achieved, for example, by selecting the predetermined frequency in such a way that the harmonics thereof and the harmonics of the signals derived therefrom do not fall within the frequency range of the magnetic resonance signal to be received of the magnetic resonance tomograph. The predetermined frequency is preferably derived from a central clock-pulse generator of the magnetic resonance tomograph.

Advantageously, the suitable frequency selection and the stable frequency relationship ensure that the pilot tone signal does not disrupt the image-forming magnetic resonance signals and cause artifacts.

In an embodiment, the magnetic resonance tomograph is configured to apply a control signal to the control input during emission of an excitation pulse for nuclear spins to interrupt the phase-locked loop.

BRIEF DESCRIPTION OF THE FIGURES

FIG. 1 depicts a schematic representation of a magnetic resonance tomograph with an electronic device according to an embodiment.

DETAILED DESCRIPTION

Figure 1:
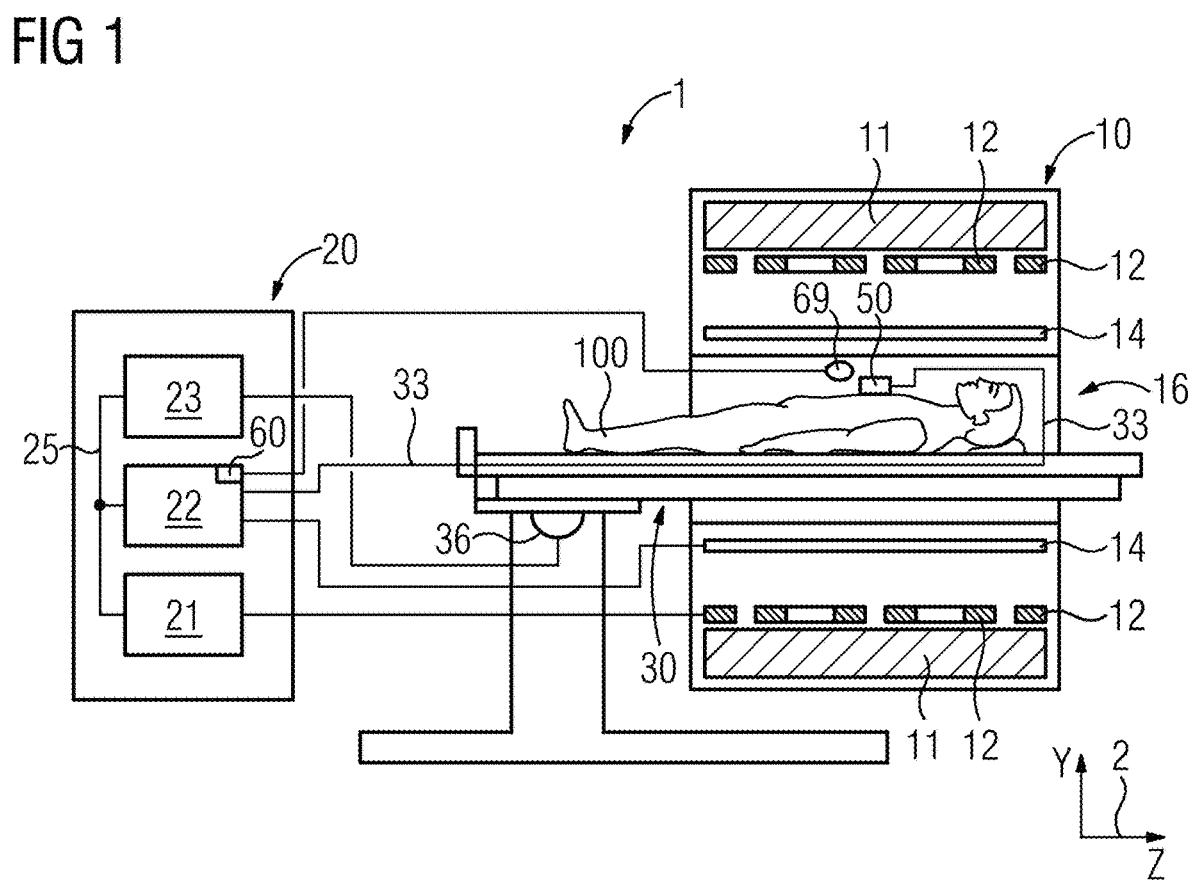
Figure 2:
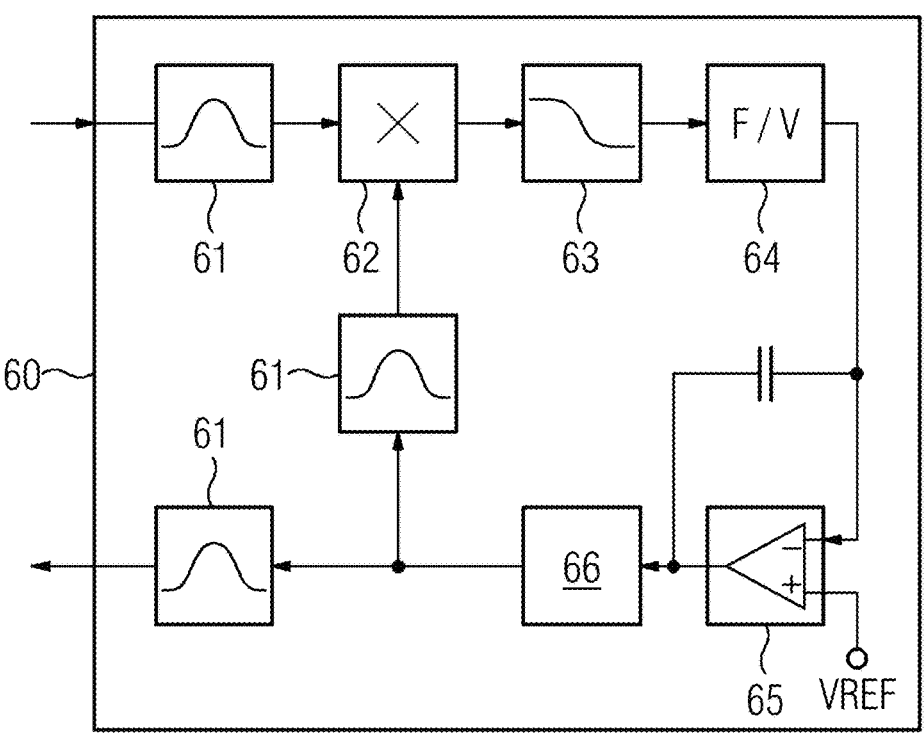
FIG. 2 depicts a schematic representation of a transmit device according to an embodiment.

FIG. 1 depicts a schematic representation of one embodiment of a magnetic resonance tomograph 1 with a transmit device.

The magnet unit 10 includes a field magnet 11 that generates a static magnetic field B0 for orienting nuclear spins of samples or of the patient 100 in a capture region. The capture region is distinguished by an extremely homogeneous static magnetic field B0, wherein the homogeneity relates for example to the strength or magnitude of the magnetic field. The capture region is virtually spherical and arranged in a patient tunnel 16 that extends in a longitudinal direction 2 through the magnet unit 10. A patient couch 30 may be moved in the patient tunnel 16 by the positioning unit 36. The field magnet 11 is conventionally a superconductive magnet that may provide magnetic fields with a magnetic flux density of up to 3 T or even higher in the case of the latest equipment. Permanent magnets or electromagnets with normally conductive coils may, however, also be used for lower magnetic field strengths.

The magnet unit 10 further includes gradient coils 12 that are configured to overlay temporally and spatially variable magnetic fields in three spatial directions on the magnetic field B0 for spatial differentiation of the acquired imaging regions in the examination volume. The gradient coils 12 are conventionally coils of normally conductive wires that are capable of generating fields orthogonal to one another in the examination volume.

The magnet unit 10 likewise includes a body coil 14 that is configured to emit a radio frequency signal supplied via a signal line into the investigation volume and to receive resonance signals emitted by the patient 100 and deliver them via a signal line.

A control unit 20 supplies the magnet unit 10 with the various signals for the gradient coils 12 and the body coil 14 and evaluates the received signals.

The control unit 20 accordingly includes a gradient driver 21 that is configured to supply the gradient coils 12 via supply lines with variable currents that provide the desired gradient fields in the examination volume in a time-coordinated manner.

The control unit 20 furthermore includes a radio frequency unit 22 that is configured to generate a radio frequency pulse with a specified time profile, amplitude, and spectral power distribution in order to excite magnetic resonance of the nuclear spins in the patient 100. Pulse powers in the kilowatt range may be reached here. The excitation signals may be emitted via the body coil 14 or indeed via a local transmitting antenna into the patient 100.

A controller 23 communicates via a signal bus 25 with the gradient controller 21 and the radio frequency unit 22.

To receive the magnetic resonance signal, a local coil 50 is arranged on the patient 100 in the patient tunnel 16, to acquire magnetic resonance signals from an examination region in the immediate vicinity with the greatest possible signal to noise ratio. The local coil 50 is in signal connection via a connecting line 33 with a receiver in the radio frequency unit 22.

The transmit device may be part of the radio-frequency unit 22 and is explained in greater detail in relation to the following figures.

The transmit device 60 sends the pilot tone signal into the body of the patient 100 via one or more antennas 69 of the magnetic resonance tomograph 1. The antennas 69 are conventionally configured as induction coils or magnetic field coupling loops. The antenna or antennas 69 may be arranged in the vicinity of the organ movements to be acquired, for example on the upper abdomen or below the rib cage. The antenna 69 may here also be integrated into a spine coil or another local coil 50. Having multiple spatially distributed antennas 69 enables the creation of additional coupling paths through the body region moved by the heartbeat. Since the signals may be transmitted and processed separately in the receivers due to their frequency spacing relative to one another, the information additionally obtained in this way results in an improved SNR in the demodulated receive signal. The illumination may, as it were, be improved with the pilot tone signal, such that at least one of the signals may always be acquired by one of the antennas 69 with sufficient strength and modulation through movement of the local coil 50.

FIG. 2 depicts a schematic representation of an embodiment of a transmit device. In this embodiment, a first input signal is supplied to the transmit device that may be derived from a central clock-pulse generator that also specifies the frequencies for excitation pulses for the nuclear spins and also for mixed and/or sampling frequencies of the receive path. The first input signal thus also simultaneously specifies the frequency for the first frequency component of the pilot tone signal. The frequency of the input signal is selected such that the harmonics thereof do not fall into any of the MRI receive bands or into any of the alias bands of the subsequent sampling. The spacing between the individual pilot tone signal frequencies is additionally selected to be sufficiently small for the intermodulation products arising at non-linearities of the receive path that are potentially present, that may be of a disruptively high level due to their low harmonic order, not to be able to fall into the MRI receive band.

Frequency values are stated here, by way of example, for a magnetic resonance tomograph with a magnetic field strength B0 of 1.5 T. The Larmor frequency is then 63.6 MHz. If this signal may be sampled at a sampling rate of 10 MS/s, the first input signal may then be selected for example with a frequency of 62.5 MHz.

After filtering by a bandpass filter 61, the first input signal is supplied with a mixer 62, that mixes the first input signal with an oscillator signal. The oscillator signal here indicates the frequency for the second frequency component of the pilot tone signal and is part of the control loop for stabilizing the frequency spacing. Generation is explained below.

By mixing the oscillator signal with the first input signal, mixed products are generated with frequencies that correspond to the sum and the difference of the frequencies of the two signals. Using a low pass filter 63, the difference value, i.e., the mixed signal with a frequency in the range from hertz to kHz, is here filtered out, wherein the frequency value also corresponds to the frequency spacing of the first and second frequency components of the pilot tone signal. In a specific numerical example, a frequency spacing of 100 Hz is selected.

The mixed signal is then supplied to a frequency-voltage converter 64, that, with a monotonically rising or monotonically falling characteristic curve, delivers a voltage corresponding to the frequency as output signal.

In an integrator 65 or operational amplifier, the generated voltage is compared with a reference voltage and the difference is summed or integrated. The reference voltage predetermines the frequency spacing. The integrator 65 includes negative feedback via a capacitor, also to prevent oscillation of the control circuit. In the event of deviation, the integrator 65 outputs a control voltage, that supplies a voltage-controlled oscillator 66. The output signal of the oscillator 66 is supplied to the mixer 62 via a bandpass filter 61, in order to close the control loop.

The control loop for the frequency offset stabilizer thus preferably includes the frequency-voltage converter 64, the integrator 65, and a voltage-controlled oscillator 66. The mixer 62 ensures that control accuracy is improved by calculation of the difference between the frequencies.

At the same time, the signal of the oscillator 66 is spectrally filtered via a bandpass filter 61 and output as the second frequency component of the pilot tone signal. The control loop keeps the frequency of the second frequency component constant at the frequency spacing relative to the first frequency component.

The first frequency component and the second frequency component are advantageously in each case supplied to associated magnetic field coupling loops in the form of antennas 69 that are arranged spatially separately from one another. This spatial separation ensures that additional coupling paths are created through the body region moved by the heartbeat. Since the signals may be transmitted and processed separately in the receivers due to their frequency spacing relative to one another, the information additionally obtained in this way results in an improved SNR in the demodulated receive signal.

Figure 3:
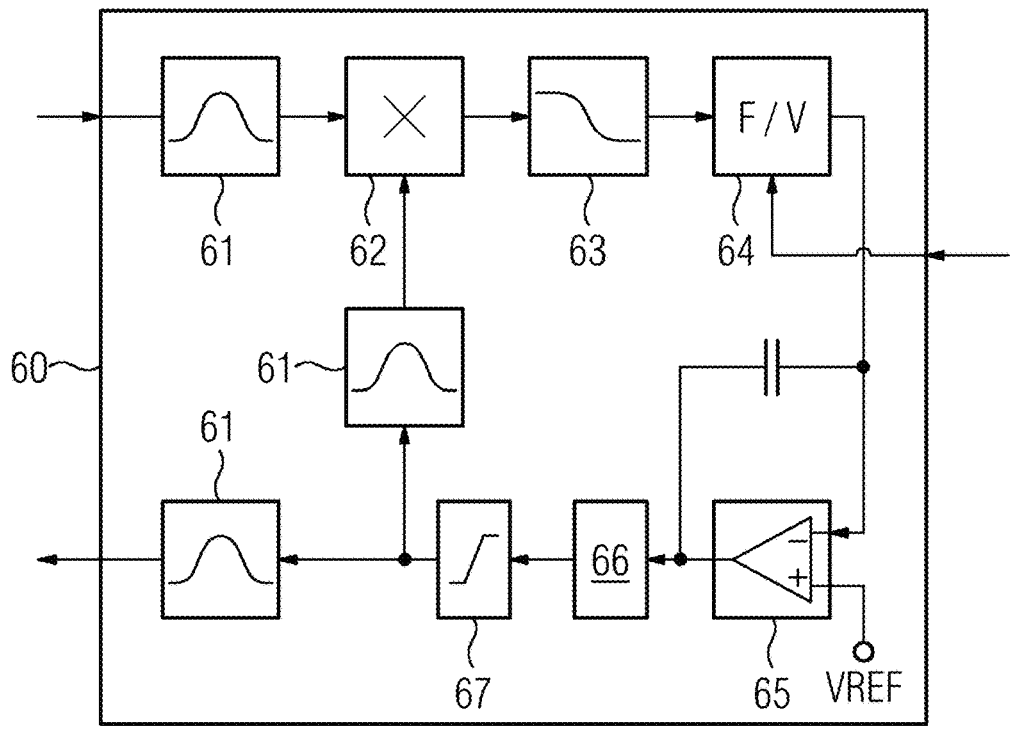
FIG. 3 depicts a schematic representation of a transmit device according to an embodiment.

FIG. 3 depicts an embodiment of the transmit device 60. The same items are designated by the same reference signs and the explanations given in regard to FIG. 2 apply.

The subject matter of FIG. 3 differs from the subject matter of FIG. 2 in that the oscillator does not oscillate directly at the frequency to be generated of 62.5 MHZ. Voltage-controlled oscillators are best implemented with quartz oscillators with quartz crystals with an "AT" cut. However, such quartz crystals may only be sensibly implemented for frequencies of up to 30 MHz.

In the embodiment of FIG. 3, a voltage-controlled oscillator 66 is therefore used that oscillates at a third of the frequency to be achieved, i.e., at 12.5 MHz. This is then multiplied to reach the desired frequency. To this end, in the embodiment, the output signal of the oscillator 66 is converted with a Schmitt trigger 67 into a square-wave signal that includes a strong third harmonic of the desired target frequency. The other harmonics are suppressed using a bandpass filter 61.

Furthermore, the embodiment includes a control input, via which the frequency-voltage converter 64 and thus the control loop may be interrupted. If the output of the frequency-voltage converter 64 is set to a high impedance state by the control input, the capacitance in the negative feedback branch of the integrator 65 maintains the inverting input at a constant voltage value for a given time, such that for a short period, for example during emission of an excitation pulse, control may be interrupted to avoid disturbance.

The controller 23 of the magnetic resonance tomograph generates a blanking signal for the control loop during the excitation pulse or indeed over the course of gradient flanks.

It is to be understood that the elements and features recited in the appended claims may be combined in different ways to produce new claims that likewise fall within the scope of the present disclosure. Thus, whereas the dependent claims appended below depend from only a single independent or dependent claim, it is to be understood that the dependent claims may, alternatively, be made to depend in the alternative from any preceding or following claim, whether independent or dependent, and that such new combinations are to be understood as forming a part of the present specification.

While the present disclosure has been described above by reference to various embodiments, it may be understood that many changes and modifications may be made to the described embodiments. It is therefore intended that the foregoing description be regarded as illustrative rather than limiting, and that it be understood that all equivalents and/or combinations of embodiments are intended to be included in this description.

The invention claimed is:

1. A transmit device for a pilot tone signal for use in a magnetic resonance apparatus, wherein the pilot tone signal includes a plurality of discrete frequency components, the transmit device comprising:

a frequency stabilization unit configured to keep a frequency difference between the plurality of discrete frequency components constant.

2. The transmit device of claim 1, wherein the transmit device further comprises:

a signal input for a first input signal and the frequency stabilization unit is configured to stabilize the frequency difference of the plurality of discrete frequency components as a function of the input signal.

3. The transmit device of claim 1, wherein the frequency stabilization unit includes a control loop with a frequency offset stabilizer.

4. The transmit device of claim 3, wherein the frequency offset stabilizer includes a frequency-voltage converter, an integrator, and a voltage-controlled oscillator.

5. The transmit device of claim 3, wherein the control loop includes an oscillator that is configured to oscillate at a frequency equal to an odd-numbered divisor of the frequency of an output signal of the frequency stabilization unit.

6. The transmit device of claim 3, wherein the control loop includes a control input that is configured to interrupt the control loop in such a way that an output frequency of the frequency stabilization unit remains unchanged for a duration of the interruption.

7. A magnetic resonance tomograph comprising:

a transmit device configured for transmitting a pilot tone signal, wherein the pilot tone signal includes a plurality of discrete frequency components, the transmit device comprising a frequency stabilization unit configured to keep a frequency difference between the plurality of discrete frequency components constant;

wherein the plurality of discrete frequency components lie in a reception range of a receiver for magnetic resonance signals of the magnetic resonance tomograph and the receiver is configured to acquire the pilot tone signal with all the plurality of discrete frequency components.

8. The magnetic resonance tomograph of claim 7, wherein the magnetic resonance tomograph is configured to supply an input signal of predetermined frequency to the transmit device, such that the input signal and the frequency components derived therefrom do not disrupt reception of the magnetic resonance signals.

9. The magnetic resonance tomograph of claim 7, wherein the frequency stabilization unit includes a control loop with a frequency offset stabilizer, wherein the control loop includes a control input that is configured to interrupt the control loop in such a way that an output frequency of the frequency stabilization unit remains unchanged for a duration of the interruption, and wherein the magnetic resonance tomograph is configured to apply a control signal to the control input during emission of an excitation pulse for nuclear spins to interrupt the control loop.

* * * * *